(12) United States Patent
Sun

(10) Patent No.: US 8,760,207 B2
(45) Date of Patent: Jun. 24, 2014

(54) FLIP-FLOP AND FREQUENCY DIVIDING CIRCUIT WITH FLIP-FLOP

(75) Inventor: Weigang Sun, LaPalma, CA (US)

(73) Assignee: MStar Semiconductor, Inc. (TW)

( * ) Notice: Subject to any disclaimer, the term of this patent is extended or adjusted under 35 U.S.C. 154(b) by 181 days.

(21) Appl. No.: 13/087,021

(22) Filed: Apr. 14, 2011

(65) Prior Publication Data

US 2011/0254595 A1 Oct. 20, 2011

(51) Int. Cl.
*H03K 3/356* (2006.01)
*H03K 21/10* (2006.01)
*H03K 23/00* (2006.01)

(52) U.S. Cl.
CPC .......... *H03K 3/356139* (2013.01); *H03K 21/10* (2013.01); *H03K 23/00* (2013.01)
USPC ....................................................... 327/208

(58) Field of Classification Search
USPC .......... 327/199–203, 208, 210–212, 215, 218
See application file for complete search history.

(56) References Cited

U.S. PATENT DOCUMENTS 7,425,850 B2 * 9/2008 Widerin ..................... 327/117
2003/0052720 A1 * 3/2003 Tung et al. .................. 327/218

FOREIGN PATENT DOCUMENTS

CN          1648972 A      8/2005

* cited by examiner

*Primary Examiner* — Sibin Chen
(74) *Attorney, Agent, or Firm* — Han IP Corporation

(57) ABSTRACT

Various embodiments of a flip-flop and a frequency dividing circuit are provided. In one aspect, a flip-flop includes an input stage and a latch stage. The input stage is capable of converting an input signal to an output signal under the control of a first clock signal and a second clock signal. The latch stage is capable of latching the output signal under the control of a third clock signal and a fourth clock signal. The first clock signal, the second clock signal, the third clock signal and the fourth clock signal have different phases.

7 Claims, 4 Drawing Sheets

FLIP-FLOP AND FREQUENCY DIVIDING CIRCUIT WITH FLIP-FLOP

CROSS REFERENCE TO RELATED PATENT APPLICATIONS

This patent application claims priority from Taiwan Patent Application No. 099112343 filed in the Taiwan Patent Office on Apr. 20, 2010, entitled "Flip-Flop and Frequency Dividing Circuit with Flip-Flop", and incorporates the Taiwan patent application in its entirety by reference.

TECHNICAL FIELD

The present disclosure relates to a frequency dividing circuit, and more particularly to a frequency dividing circuit having a same number of input clocks and output clocks.

BACKGROUND OF THE PRESENT DISCLOSURE

Generally, a clock frequency divider is constructed by two serial D flip-flops. FIG. 1 is a schematic diagram of a conventional clock frequency divider 10 comprising a first D flip-flop 12 and a second D flip-flop 14. The first flip-flop 12 has a positive-phase data output end coupled to a positive-phase data input end of the second D flip-flop 14, and a negative-phase data output end coupled to a negative-phase data input end of the second D flip-flop 14. The second D flip-flop 14 has a positive-phase data output end coupled to a negative-phase data input end of the first flip-flop 12, and a negative-phase data output end coupled to a positive-phase data input end of the first flip-flop 12. In addition, the first D flip-flop 12 and the second D flip-flop 14 are controlled by a differential pair of input clocks clk and clkb. The first input clock clk is coupled to a sampling control end of the first D flip-flop 12 and a latch control end of the second D flip-flop 14, and the second input clock clkb is coupled to a latch control end of the first D flip-flop 12 and a sampling control end of the second D flip-flop 14. Therefore, the clock frequency divider 10 divides by the differential pair of input clocks clk and clkb to generate four frequency-divided output clocks clk1, clk2, clk3 and clk4 having phases differences of 90 degrees, e.g., phases of the output clocks clk1, clk2, clk3 and clk4 are respectively 0 degree, 90 degrees, 180 degrees and 270 degrees.

As mentioned above, since the conventional clock frequency divider generates four output clocks having different phases according to two input clocks, when two conventional frequency dividers are coupled in series to perform a divide-by-four calculation, a second-stage frequency divider only receives two output clocks of the four output clocks outputted by a first-stage frequency divider. In other words, load conditions of four output ends of the first-stage frequency divider are not completely identical, so that errors occur in the phases of the four output clocks generated by the first-stage frequency divider. Accordingly, when an operating circuit, e.g., a modulator circuit, performs modulation/demodulation on a data signal via the foregoing four output clocks having phase errors (i.e., the four output clocks generated by the first-stage frequency divider), serious errors may occur in a modulated/demodulated data. Therefore, a solution for frequency dividing a group of clock signals while maintaining accurate phases is in need.

SUMMARY OF THE PRESENT DISCLOSURE

One object of the present disclosure is to provide a frequency dividing circuit having a same number of input clocks and output clocks.

According to a first embodiment of the present disclosure, a flip-flop comprising an input stage and a latch stage is provided. The input stage is capable of converting an input signal to an output signal under the control of a first clock signal and a second clock signal. The latch stage latches the output signal under the control of a third clock signal and a fourth clock signal. The first clock signal, the second clock signal, the third clock signal and the fourth clock signal respectively have different phases.

According to a second embodiment of the present disclosure, a frequency dividing circuit comprising a first flip-flop and a second flip-flop is provided. The first flip-flop controls its input end according to a first clock signal and a second clock signal, and controls its output end according to a third clock signal and a fourth clock signal. The second flip-flop has an input end coupled to the output end of the first flip-flop, and an output end coupled to the input end of the first flip-flop. The second flip-flop controls its input end according to the third clock signal and the fourth clock signal, and controls its output end according to the first clock signal and the second clock signal. The first clock signal, the second clock signal, the third clock signal and the fourth clock signal respectively have different phases.

DETAILED DESCRIPTION OF THE PREFERRED EMBODIMENT

Figure 1:
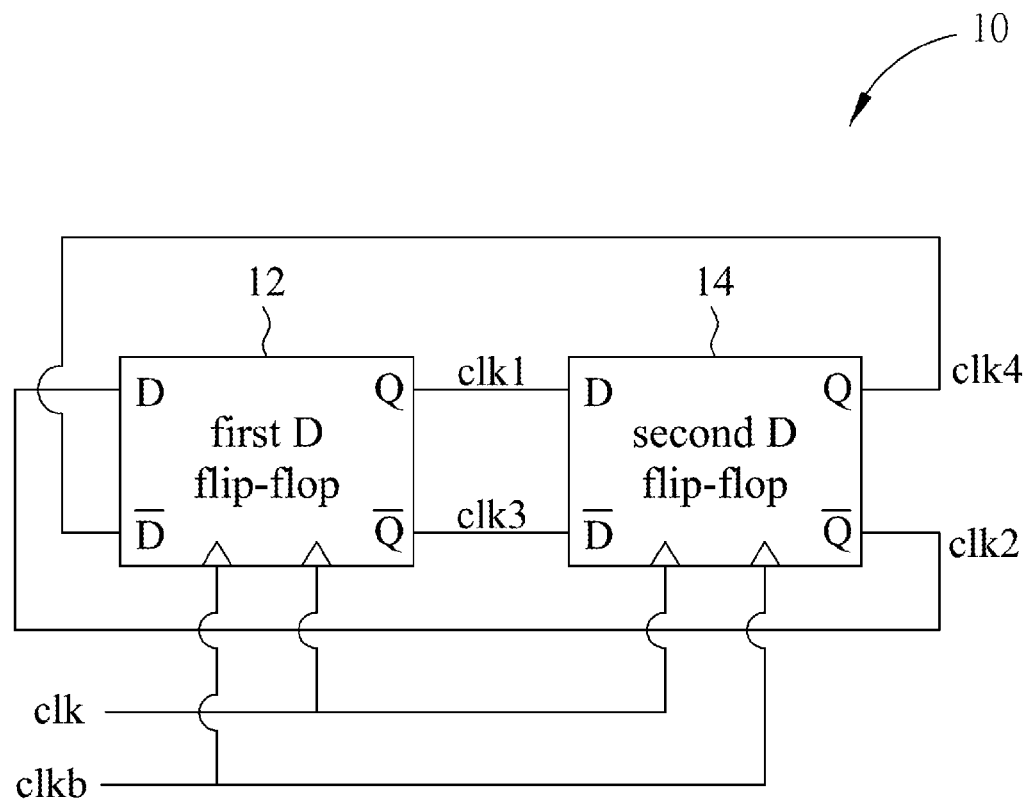
FIG. 1 is a schematic diagram of a conventional clock frequency divider.
Figure 2:
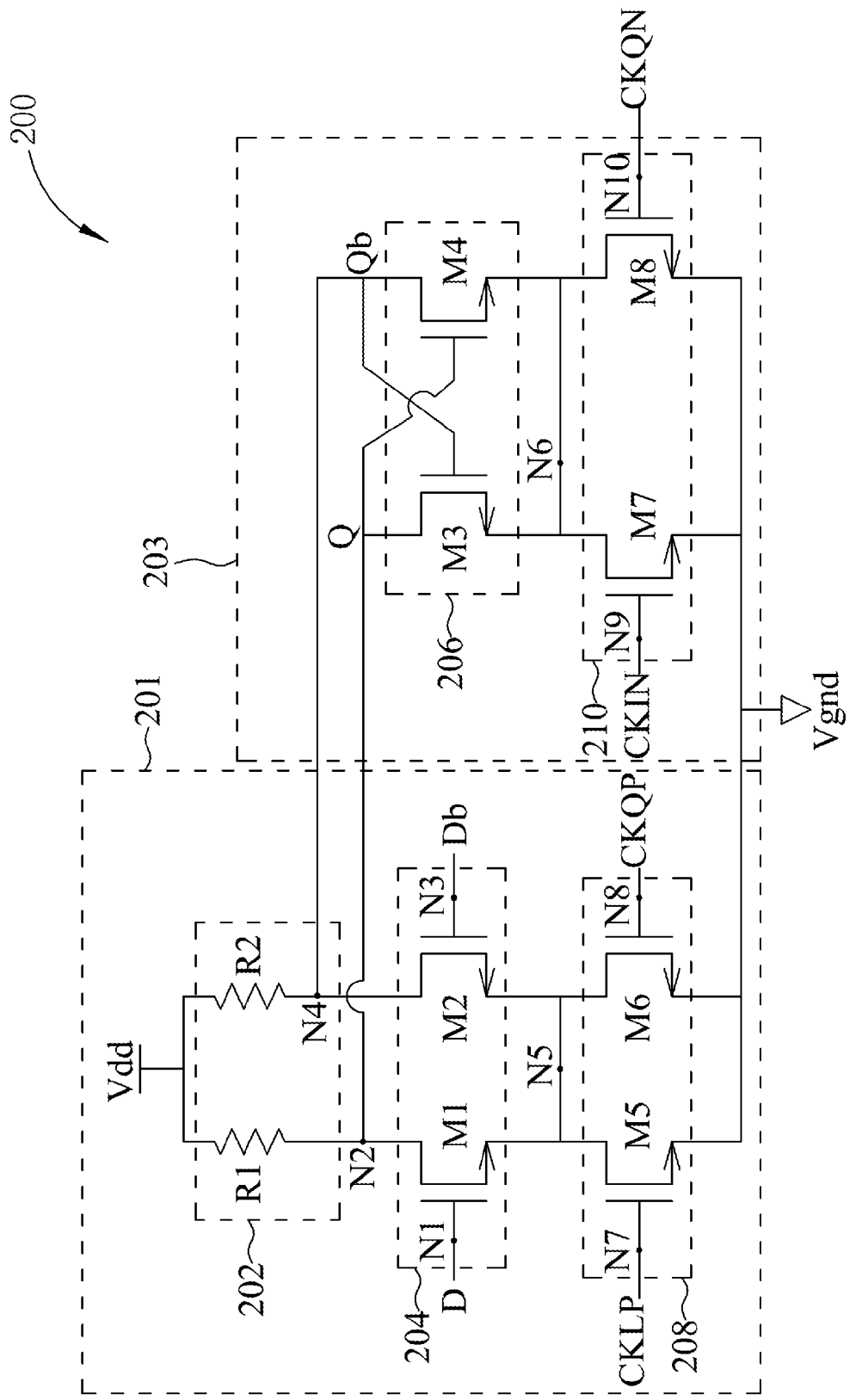
FIG. 2 is a schematic diagram of a flip-flop in accordance with an embodiment of the present disclosure.

FIG. 2 is a schematic diagram of a flip-flop 200 in accordance with an embodiment of the present disclosure. The flip-flop 200 comprises an input stage 201 and a latch stage 203. The input stage 201 comprises a load 202, a signal input circuit 204 and a first control circuit 208. The latch stage 203 comprises a cross-coupled pair circuit 206 and a second control circuit 210. The load 202 is coupled to a first voltage level Vdd that is a power supply voltage. The signal input circuit 204 serially connected to the load 202 receives input signal D and Db. In this embodiment, the input signal is a differential pair. The cross-coupled pair circuit 206 coupled to a connection node of the load 202 and the signal input circuit 204 generates a differential pair of output signals Q and Qb. The first control circuit 208 coupled between the signal input circuit 204 and a second voltage level Vgnd receives a first clock signal CKIP and a second clock signal CKQP, and the second voltage level Vgnd is a ground voltage. The second control circuit 210 coupled between the cross-coupled pair circuit 206 and the second voltage level Vgnd receives a third clock signal CKIN and a fourth clock signal CKQN. The first clock signal CKIP, the second clock signal CKQP, the third clock signal CKIN and the fourth clock signal CKQN respectively have a first phase P1, a second phase P2, a third phase P3 and a fourth phase P4, which are different from each other. For example, in an embodiment, a difference between the first phase P1 and the second P2 is approximately equal to 90 degrees, and a difference between the third phase P3 and the fourth P4 is approximately equal to 90 degrees. In another embodiment, a difference between the first phase P1 and the third phase P3 is approximately equal to 180 degrees, and a difference between the second phase P2 and the fourth phase P4 is approximately equal to 180 degrees.

In this embodiment, the load 202 comprises a first resistor R1 having a first end coupled to the first voltage level Vdd, and a second resistor R2 having a first end coupled to the first voltage level Vdd. The signal input circuit 204 comprises a first transistor M1 and a second transistor M2. The first transistor M1 has a control end N1 coupled to the first input signal D of the input signals D and Db, and a first output end N2 coupled to a second end of the first resistor R1. The second transistor M2 has a control end N3 coupled to a second input signal Db of the input signals D and Db, a first output end coupled to a second end of the second resistor R2, and a second output end N5 coupled to a second output end of the first transistor M1. The cross-coupled pair circuit 206 comprises a third transistor M3 and a fourth transistor M4. The third transistor M3 has a control end coupled to the second end of the second resistor R2, and a first output end coupled to the second end of the first resistor R1. The fourth transistor M4 has a control end coupled to the second end of the first resistor, a first output end coupled to the second end of the second resistor, and a second output end N6 coupled to a second end of the third transistor M3. The first control circuit 208 comprises a fifth transistor M5 and a sixth transistor M6. The fifth transistor M5 has a control end N7 coupled to the first clock signal CKIP, a first output end coupled to the second output end of the first transistor M1, and a second output end coupled to the second voltage level Vgnd. The sixth transistor M6 has a control end N8 coupled to the second clock signal CKQP, a first output end coupled to the second output end of the first transistor M1, and a second output end coupled to the second voltage level Vgnd. The second control circuit 210 comprises a seventh transistor M7 and an eighth transistor M8. The seventh transistor M7 has a control end N9 coupled to the third clock signal CKIN, a first output end coupled to the second output end of the third transistor M3, and a second output end coupled to the second voltage level Vgnd. The eighth transistor M8 has a control end N10 coupled to the fourth clock signal CKQN, a first output end coupled to the second output end of the third transistor M3, and a second output end coupled to the second voltage level Vgnd.

More specifically, in the flip-flop 200, the first phase P1 and the second phase P2 of the first clock signal CKIP and the second clock signal CKQP of the first control circuit 208 are a group of quadrature phases, and the third phase P3 and the fourth phase P4 of the third clock signal CKIN and the fourth clock signal CKQN of the second control circuit 210 are another group of quadrature phases. Therefore, operations of the first control circuit 208 and the second control circuit 210 are complementary operations. In other words, when the first control circuit 208 is activated, the second control circuit 210 is deactivated; otherwise, when the second control circuit 210 is activated, the first control circuit is deactivated. Accordingly, through the complementary operations of the first control circuit 208 and the second control circuit 210, the input signals D and Db are sampled (i.e., received) and latched to the cross-coupled pair circuit 206. Further, the flip-flop 200 is controlled by four clock signals having different phases, i.e., the first clock signal CKIP, the second clock signal CKQP, the third clock signal CKIN and the fourth clock signal CKQN, which are for controlling sampling and latching operations of the input signals D and Db. For example, in an application circuit, the first phase P1, the second phase P2, the third phase P3 and the fourth phase P4 of the first clock signal CKIP, the second clock signal CKQP, the third clock signal CKIN and the fourth clock signal CKQN are respectively defined as 0 degree, 90 degrees, 180 degrees and 270 degrees for sampling and latching the input signals D and Db.

Figure 3:
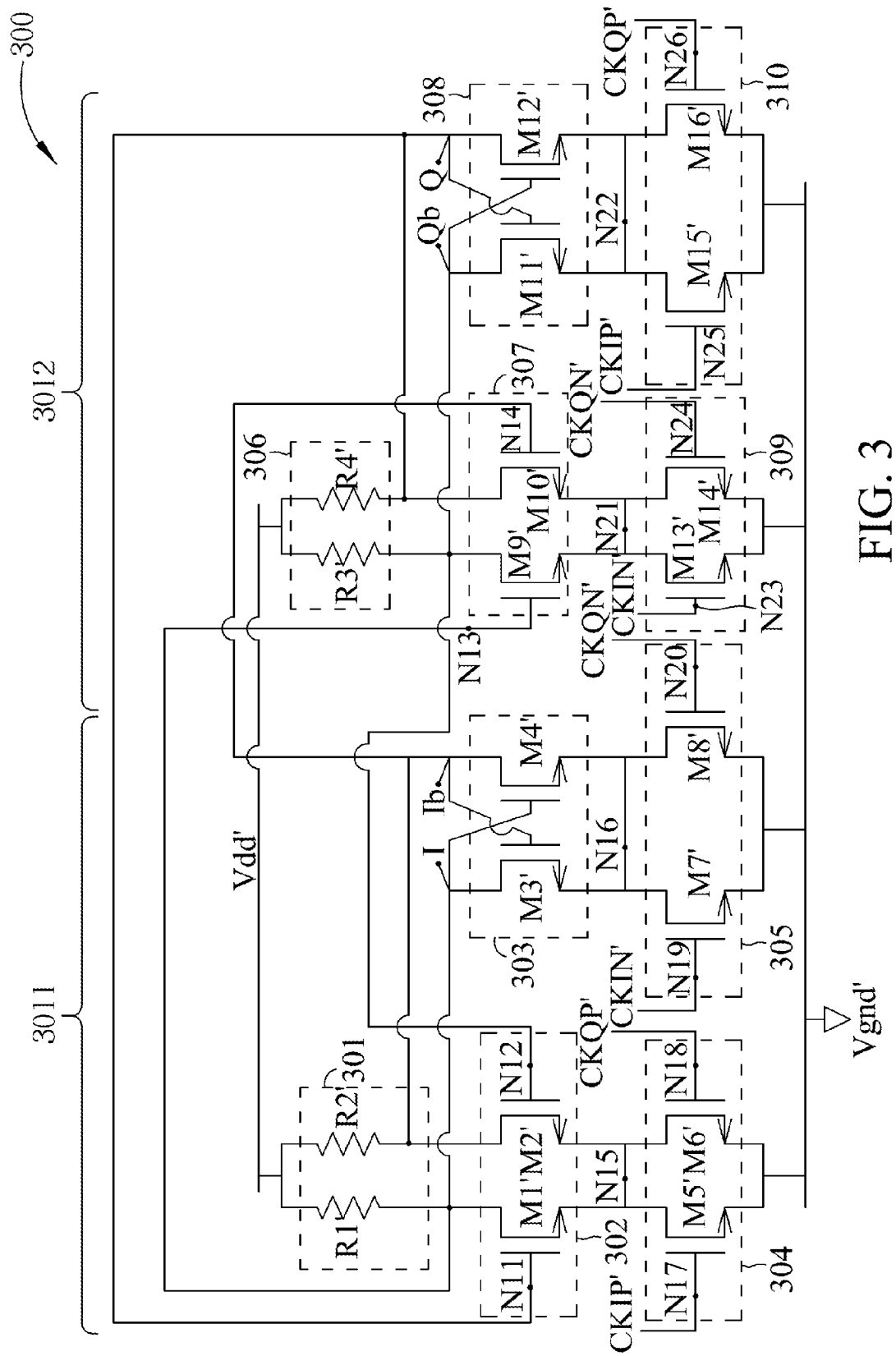
FIG. 3 is a schematic diagram of a frequency dividing circuit in accordance with an embodiment of the present disclosure.

As the circuit structure shown in FIG. 2, the flip-flop 200 is controlled by four clock signals having different phases, i.e., the first clock signal CKIP, the second clock signal CKQP, the third clock signal CKIN and the fourth clock signal CKQN, which are for controlling sampling and latching operations of the input signals D and Db and generating a differential pair of output signals Q and Qb. Accordingly, when another flip-flop is connected in series to the flip-flop 200 to form a frequency divider (as shown in FIG. 3), the frequency divider has four clocks signals (CKIP, CKQP, CKIN, CKQN) having different phases and four output signals (Q, Qb, I, Ib) having different phases. Therefore, when the foregoing two frequency dividers are connected in series for frequency division, the number of output signals of a previous stage is identical to that of input signals of a next stage. In addition, in order to obtain identical load conditions (e.g., having identical input resistances) of the first clock signals CKIP, the second clock signal CKQP, the third clock signal CKIN and the fourth clock signal CKQN, in this embodiment, sizes (i.e., aspect ratio) of the fifth transistor M5, the sixth transistor M6, the seventh transistor M7 and the eighth transistor M8 should be approximately identical to each other. Accordingly, the phases of the first clock signal CKIP, the second clock signal CKQP, the third clock signal CKIN and the fourth clock signal CKQN do not correspond to different load conditions to avoid phase errors. A detailed circuit of the frequency divider is illustrated in following paragraphs and in FIG. 3.

It is to be noted that the signal input circuit 204 and the load 202 of the flip-flop 200 are used for sampling the input signals D and Db, and the cross-coupled pair circuit 206 and the load 202 are used for latching the sampled signals. The operations and definitions are similar to a conventional D flip-flop, and shall not be described for brevity. The load 202 of the flip-flop 200 is not limited to being realized by the first resistor R1 and the second resistor R2, and any circuit component having resistance characteristics are within the scope of the present disclosure. For example, in an embodiment, the first resistor R1 and the second resistor R2 are respectively realized by a resistor connected in parallel to a capacitor. In another embodiment, the first resistor R1 and the second resistor R2 are respectively realized by an inductor connected in parallel to a capacitor.

FIG. 3 shows a schematic diagram of a frequency dividing circuit 300 in accordance with an embodiment of the present disclosure. The frequency dividing circuit 300 is a divide-by-two frequency divider, and is constructed by two flip-flops 200 coupled in series. The frequency dividing circuit 300 comprises a first flip-flop 3011 and a second flip-flop 3012. The first flip-flop comprises a first load 301, a first signal input circuit 302, a first cross-coupled pair circuit 303, a first control circuit 304, and a second control circuit 305. The second flip-flop 3012 comprises a second load 306, a second signal input circuit 307, a second cross-coupled pair circuit 308, a third control circuit 309, and a fourth control circuit 310. It is to be noted that, a structure of the first flip-flop 3011 and the second flip-flop 3012 is similar to that of the flip-flop 200 in FIG. 2, and shall not be described for brevity. FIG. 3 shows the first control circuit 304 receives a first clock signal CKIP' (i.e., N17) and a second clock signal CKQP' (i.e., N18), the second control circuit 305 receives a third clock signal CKIN' (i.e., N19) and a fourth clock signal CKQN' (i.e., N20), the third control circuit 309 receives the third clock signal CKIN' (i.e., N23) and a fourth clock signal CKQN' (i.e., N24), and the fourth control circuit 310 receives the first clock signal CKIP' (i.e., N25) and the second clock signal CKQP' (i.e., N26). In addition, the first flip-flop 3011 has an input end coupled to an output end of the second flip-flop 3012, which has an input end coupled to an output end of the first flip-flop 3011. Further, a first signal input end N11 and a second signal input end N12 are respectively coupled to a fourth signal output end (i.e., a fourth frequency-divided output signal Q) and a third signal output end (i.e., a third frequency-divided output signal Qb). A third signal input end N13 and a fourth signal input end N14 are respectively coupled to a first signal output end (i.e., a first frequency-divided output signal I) and a second signal output end (i.e., a second frequency-divided signal Ib). In addition, the first clock signal CKIP', the second clock signal CKQP', the third clock signal CKIN' and the fourth clock signal CKQN' respectively have a first phase P1', a second phase P2', a third phase P3' and a fourth phase P4', which are different from each other. For example, in an embodiment, a difference between the first phase P1' and the second P2' is approximately equal to 90 degrees, and a difference between the third phase P3' and the fourth P4' is approximately equal to 90 degrees. In another embodiment, a difference between the first phase P1' and the third phase P3' is approximately equal to 180 degrees, and a difference between the second phase P2' and the fourth phase P4 is approximately equal to 180 degrees.

As observed from the circuit structure in FIG. 3, the frequency dividing circuit 300 generates four output clock signals having different phases and same clock frequencies, i.e., the first frequency-divided output signal I, the second frequency-divided output signal Ib, the third frequency-divided output signal Qb and the fourth frequency-divided output signal Q, according to four input clock signals having different phases and same clock frequencies, i.e., the first clock signal CKIP', the second clock signal CKQP', the third clock signal CKIN' and the fourth clock signal CKQN'. The clock frequency of the output clock signals is half of that of the input clock signals. In addition, in an embodiment, phase differences among the first clock signal CKIP', the second clock signal CKQP', the third clock signal CKIN' and the fourth clock signal CKQN' are respectively 90 degrees, e.g., the phases of the first clock signal CKIP', the second clock signal CKQP', the third clock signal CKIN' and the fourth clock signal CKQN' are respectively 0 degree, 90 degrees, 180 degrees and 270 degrees. The phases of the first frequency-divided output signal I, the second frequency-divided output signal Ib, the third frequency-divided output signal Qb and the fourth frequency-divided output signal Q are respectively 0 degree, 90 degrees, 180 degrees and 270 degrees. In other words, the frequency dividing circuit 300 respectively frequency divides the input clock signals having phases of 0 degree, 90 degrees, 180 degrees and 270 degrees to generate frequency-divided output clock signals having phases of 0 degree, 90 degrees, 180 degrees and 270 degrees. Accordingly, when numerous frequency dividing circuits 300 are connected in series to frequency divide the input clock signals having phases of 0 degree, 90 degrees, 180 degrees and 270 degrees, four frequency-divided output clock signals of a previous frequency dividing circuit 300 become four input clock signals of a next frequency dividing circuit 300. Further, when two frequency dividing circuits connected in series performs frequency division, the number of output signals is the same as that of the input signals. In other words, four output ends of a first-stage frequency dividing circuit are coupled to four input ends of a second-stage frequency dividing circuit. Sizes (e.g., aspect ratios) of transistors of a first control circuit, a second control circuit, a third control circuit and a fourth control circuit of the second-stage frequency dividing circuit are approximately equal to each other. Since load conditions (e.g., input resistances) faced by four frequency-divided output clock signals of the first-stage frequency dividing circuit are approximately identical to each other, the phases of the four frequency-divided output clock signals are accurately distributed as 0 degree, 90 degrees, 180 degrees and 270 degrees, such that errors incurred in the conventional frequency divider do not occur.

Figure 4:
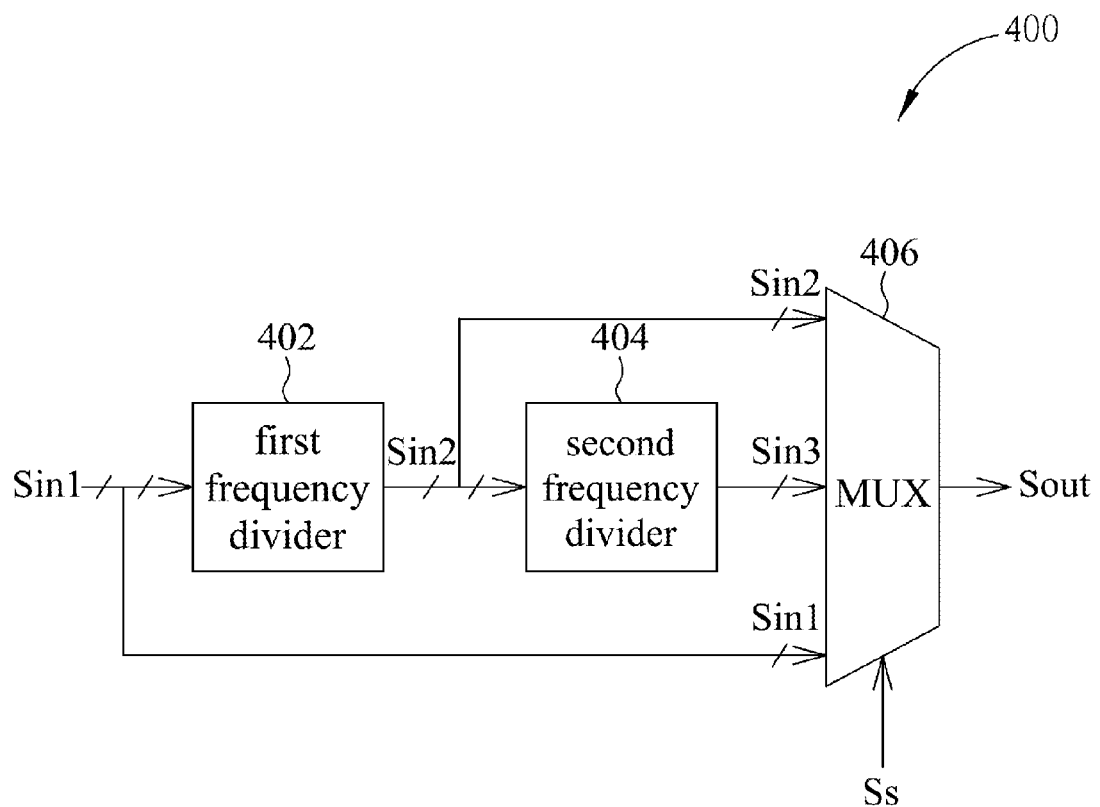
FIG. 4 is a schematic diagram of a clock generating circuit in accordance with an embodiment of the present disclosure.

For example, in a data modulating/demodulating circuit, numerous groups of clock signals having phases of 0 degree, 90 degrees, 180 degrees and 270 degrees are adopted to modulate/demodulate a data signal (e.g., the groups of clock signals respectively have clock frequencies of 2 GHz, 1 GHz and 500 MHz). FIG. 4 shows a schematic diagram of a clock generating circuit 400 in accordance with an embodiment of the present disclosure. The clock generating circuit 400 comprises a first frequency divider 402, a second frequency divider 404, and a multiplexer 406. The first frequency divider 402 and the second frequency divider 404 are realized by the frequency dividing circuit 300, which is a divide-by-two frequency dividing circuit according to the present disclosure. The first frequency divider 402 receives a first group of input clocks Sin1 having a frequency of 2 GHz, and frequency divides the first group of input clocks Sin1 to generate a second group of input clocks Sin2 having the frequency of 1 GHz. The first group of input clock Sin1 has four clock signals having phases of 0 degree, 90 degrees, 180 degrees and 270 degrees. The second frequency divider 404 receives the second group of input clocks Sin2 having the frequency of 1 GHz, and frequency divides the second group of input clocks Sin2 to generate a third input clock Sin3 having the frequency of 500 MHz. The multiplexer 406 receives the first group of input clock Sin1, the second group of input clock Sin2 and the third group of input clock Sin3, and selects one of the groups of input clocks according to a selection signal Ss as an output clock Sout. As observed from the foregoing description of the frequency dividing circuit 300, four clock signals of the second group of input clock Sin2 are received by the second frequency dividing circuit 404. Therefore, when four clock signals of the first group of input clocks Sin1 respectively have accurate phases of 0 degree, 90 degrees, 180 degrees and 270 degrees, four frequency-divided clocks, of the second group of input clock signals Sin2, generated by the first frequency dividing circuit 402 respectively have accurate phases of 0 degree, 90 degrees, 180 degrees and 270 degrees. Likewise, since the four frequency-divided clock signals of the second group of input clock signals Sin2 respectively have accurate phases of 0 degree, 90 degrees, 180 degrees and 270 degrees, four frequency-divided clock signals, of the third group of input clocks Sin3, generated by the second frequency circuit 404 respectively have accurate phases of 0 degree, 90 degrees, 180 degrees and 270 degrees. Accordingly, when an output clock Sout of the multiplexer 406 is adopted to modulate/demodulate the data signal, accurately of the modulation/demodulation result is substantially increased.

In conclusion, the frequency dividing circuit 300 provided by the present disclosure, a quadrature-in-quadrature-out clock frequency divider, not only has complete balance input clocks and output clocks, but also provides better power consumption reduction and phase noises, phase errors and signal harmonic noises removing performances than the conventional frequency divider.

While the present disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A flip-flop comprising:
   an input stage that converts an input signal to an output signal according to a first clock signal and a second clock signal; and
   a latch stage that latches the output signal according to a third clock signal and a fourth clock signal;
   wherein, the first clock signal, the second clock signal, the third clock signal, and the fourth clock signal respectively have different phases,
   wherein a phase difference between the first clock signal and the second clock signal is 90 degrees, and wherein a phase difference between the third clock signal and the fourth clock signal is 90 degrees,
   wherein a phase difference between the first clock signal and the third clock signal is 180 degrees, and wherein a phase difference between the second clock signal and the fourth clock signal is 180 degrees, and
   wherein the input stage comprises:
      a load, coupled to a first voltage level;
      a signal input circuit, serially connected to the load, that generates the output signal according to the input signal; and
      a first control circuit, coupled between the signal input circuit and a second voltage level, that activates the signal input circuit according to the first clock signal and the second clock signal.

2. The flip-flop as recited in claim 1, wherein the latch stage comprises:
   a cross-coupled pair circuit, coupled to a connection node of the load and the signal input circuit, that latches the output signal; and
   a second control circuit, coupled between the cross-coupled pair circuit and the second voltage level, that activates the cross-coupled pair circuit according to the third clock signal and the fourth clock signal.

3. The flip-flop as recited in claim 2, wherein the load comprises:
   a first resistor having a first end coupled to the first voltage level; and
   a second resistor having a first end coupled to the first voltage level;
   wherein the signal input circuit comprises:
      a first transistor having a control end that receives a first input signal of the input signal, and a first output end coupled to a second end of the first resistor; and
      a second transistor having a control end that receives a second input signal of the input signal, a first output end coupled to a second end of the second resistor, and a second output end coupled to a second output end of the first transistor; and
   wherein the cross-coupled pair circuit comprises:
      a third transistor having a control end coupled to the second end of the second resistor, and a first output end coupled to the second end of the first resistor; and
      a fourth transistor having a control end coupled to the second end of the first resistor, a first output end coupled to the second end of the second resistor, and a second output end coupled to a second output end of the third transistor.

4. The flip-flop as recited in claim 3, wherein the first control circuit comprises:
   a fifth transistor having a control end that receives the first clock signal, a first output end coupled to the second output end of the first transistor, and a second output end coupled to the second voltage level; and
   a sixth transistor having a control end that receives the second clock signal, a first output end coupled to the second output end of the first transistor, and a second output end coupled to the second voltage level; and
   wherein the second control circuit comprises:
      a seventh transistor having a control end that receives the third clock signal, a first output end coupled to the second output end of the third transistor, and a second output end coupled to the second voltage level; and
      an eighth transistor having a control end that receives the fourth clock signal, a first output end coupled to the second output end of the third transistor, and a second output end coupled to the second voltage level.

5. The flip-flop as recited in claim 4, wherein the fifth transistor, the sixth transistor, the seventh transistor, and the eighth transistor have approximately identical sizes.

6. A frequency dividing circuit, comprising:
   a first flip-flop having an input end for signal reception under control of a first clock signal and a second clock signal, and an output end for signal latching under the control of a third clock signal and a fourth clock signal; and
   a second flip-flop having an input end coupled to the output end of the first flip-flop, an output end coupled to the input end of the first flip-flop, wherein the input end of the second flip-flop is for signal reception under control of the third clock and the fourth clock, and wherein the output end of the second flip-flop is for signal latching under the control of the first clock signal and the second clock signal;
   wherein, the first clock signal, the second clock signal, the third clock signal, and the fourth clock signal respectively have different phases,
   wherein, a phase difference between the first clock signal and the second clock signal is 90 degrees, and wherein a phase difference between the third clock signal and the fourth clock signal is 90 degrees,
   wherein, a phase difference between the first clock signal and the third clock signal is 180 degrees, and wherein a phase difference between the second clock signal and the fourth clock signal is 180 degrees,
   wherein the first flip-flop comprises:
      a first input stage that receives an output signal of the second flip-flop under control of the first clock signal and the second clock signal to generate a first frequency-divided output signal and a second frequency-divided output signal; and
      a first latch stage that latches the first frequency-divided output signal and the second frequency-divided output signal under control of the third clock signal and the fourth clock signal, and
   wherein the input stage comprises:
      a load, coupled to a first voltage level;
      a signal input circuit, serially connected to the load, that generates the output signal according to the input signal; and
      a first control circuit, coupled between the signal input circuit and a second voltage level, that activates the signal input circuit according to the first clock signal and the second clock signal.

7. The frequency dividing circuit as recited in claim 6, wherein the second flip-flop comprises:
- a second input stage that receives an output signal of the first flip-flop under control of the third clock signal and the fourth clock signal to generate a third frequency-divided output signal and a fourth frequency-divided output signal; and
- a second latch stage that latches the third frequency-divided output signal and the fourth frequency-divided output signal under control of the first clock signal and the second clock signal.

\* \* \* \* \*